United States Patent [19]
Niggemann

[11] Patent Number: 6,152,215
[45] Date of Patent: Nov. 28, 2000

[54] HIGH INTENSITY COOLER

[75] Inventor: Richard Everett Niggemann, Rockford, Ill.

[73] Assignee: Sundrand Corporation, Rockford, Ill.

[21] Appl. No.: 09/220,115

[22] Filed: Dec. 23, 1998

[51] Int. Cl.[7] .................. F28F 7/00; F28F 3/00; F28D 15/00
[52] U.S. Cl. .................. 165/166; 165/80.4; 165/104.33
[58] Field of Search .................. 165/166, 80.4, 165/104.33; 361/700; 257/715

[56] References Cited

U.S. PATENT DOCUMENTS

| | | | |
|---|---|---|---|
| 2,005,515 | 6/1935 | Winkler | 165/166 |
| 4,459,082 | 7/1984 | Niggemann . | |
| 4,494,171 | 1/1985 | Bland et al. . | |
| 4,559,580 | 12/1985 | Lutfy . | |
| 4,614,227 | 9/1986 | Vogel . | |
| 4,697,427 | 10/1987 | Niggemann et al. . | |
| 4,705,102 | 11/1987 | Kanda et al. | 165/104.33 |
| 4,962,444 | 10/1990 | Niggemann . | |
| 5,016,707 | 5/1991 | Nguyen . | |
| 5,021,924 | 6/1991 | Kieda et al. | 361/700 |
| 5,025,856 | 6/1991 | VanDyke et al. . | |
| 5,029,640 | 7/1991 | Niggemann . | |
| 5,031,693 | 7/1991 | VanDyke . | |
| 5,034,688 | 7/1991 | Moulene et al. . | |
| 5,239,200 | 8/1993 | Messina et al. | 165/80.4 |
| 5,285,351 | 2/1994 | Ikeda | 165/104.33 |
| 5,349,831 | 9/1994 | Daikoku | 165/80.4 |
| 5,491,363 | 2/1996 | Yoshikawa | 165/80.4 |
| 5,931,219 | 8/1999 | Kull et al. | 165/166 |
| 5,954,126 | 9/1999 | Armbruster | 165/166 |

FOREIGN PATENT DOCUMENTS

| | | |
|---|---|---|
| 1107 260 | 5/1961 | Germany . |
| WO 84/02177 | 6/1984 | WIPO .................. 165/80.4 |

*Primary Examiner*—Ira S. Lazarus
*Assistant Examiner*—Tho Duong
*Attorney, Agent, or Firm*—Marshall, O'Toole, Gerstein, Murray & Borun

[57] ABSTRACT

A high intensity cooling device is disclosed. The cooling device includes first and second superimposed laminations, with each of the laminations including a cavity having a spiral fin defining a spiral flow chamber. One of the flow chambers directs a coolant medium along an inwardly spiraling flow path, while the other of the flow chambers directs the coolant medium along an outwardly spiraling flow path, with the flow chambers being in flow communication. A coolant inlet communicates the coolant medium to the first flow chamber, and a coolant outlet communicates the coolant medium away from the second flow chamber. Thus, the coolant medium may be routed along a spiral flow path through each of the laminations.

35 Claims, 11 Drawing Sheets

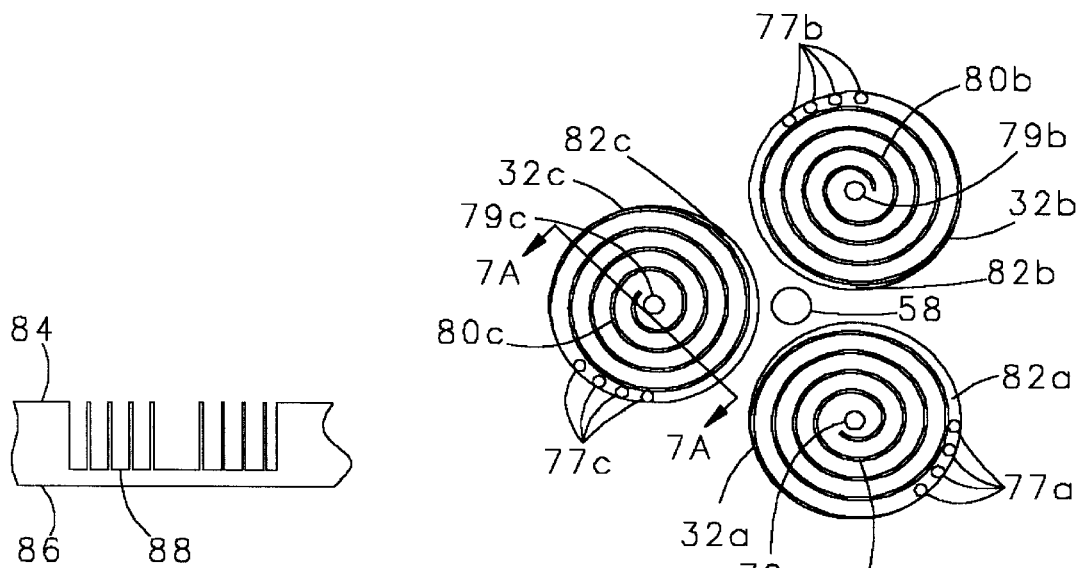
FIG. 7A
FIG. 7
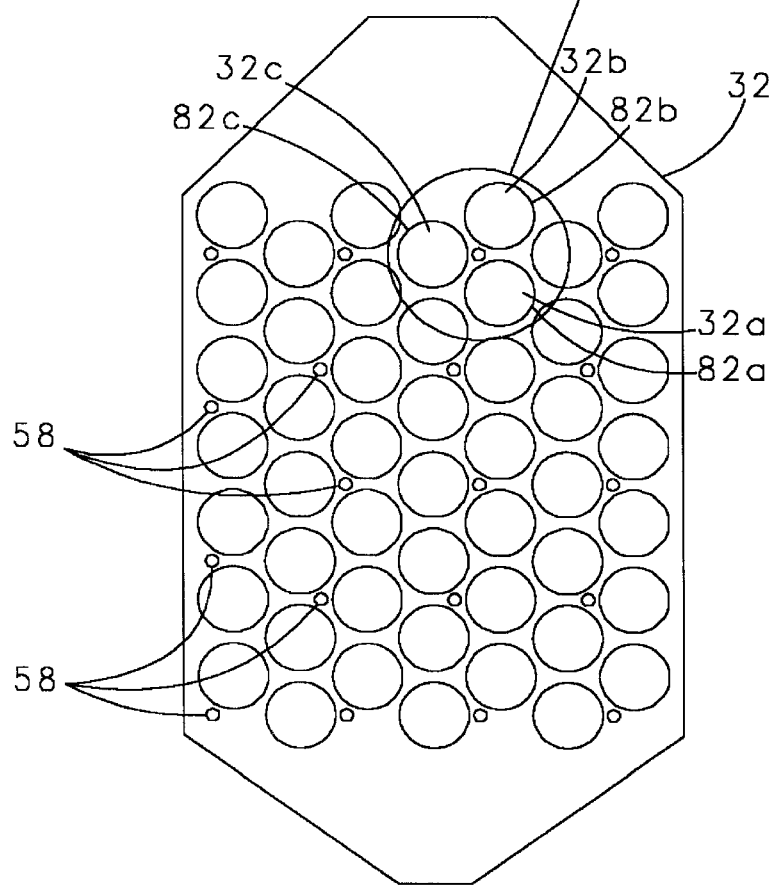
FIG. 6

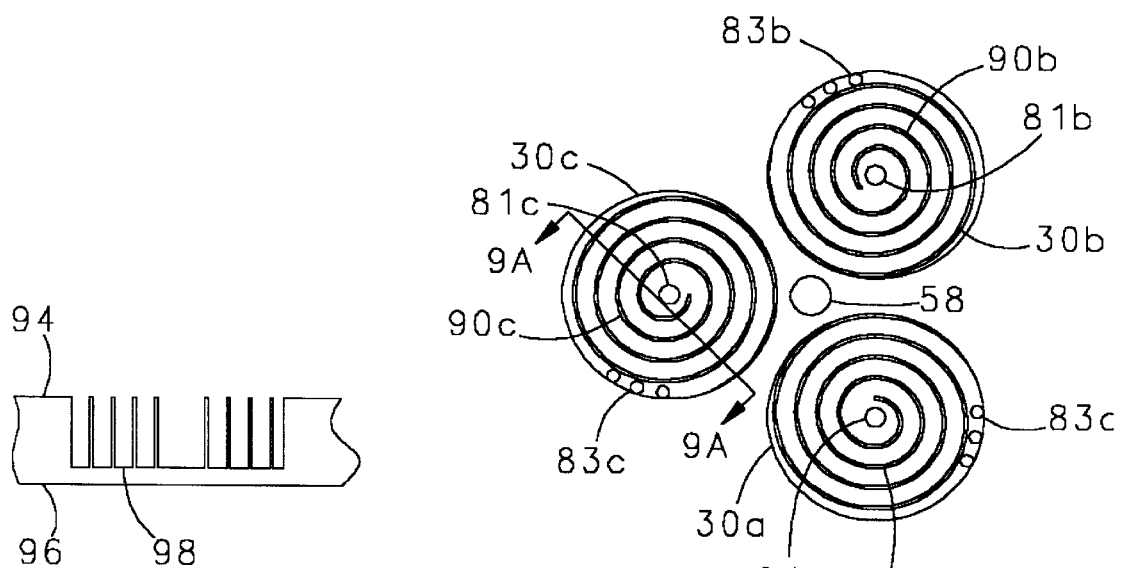
FIG. 9
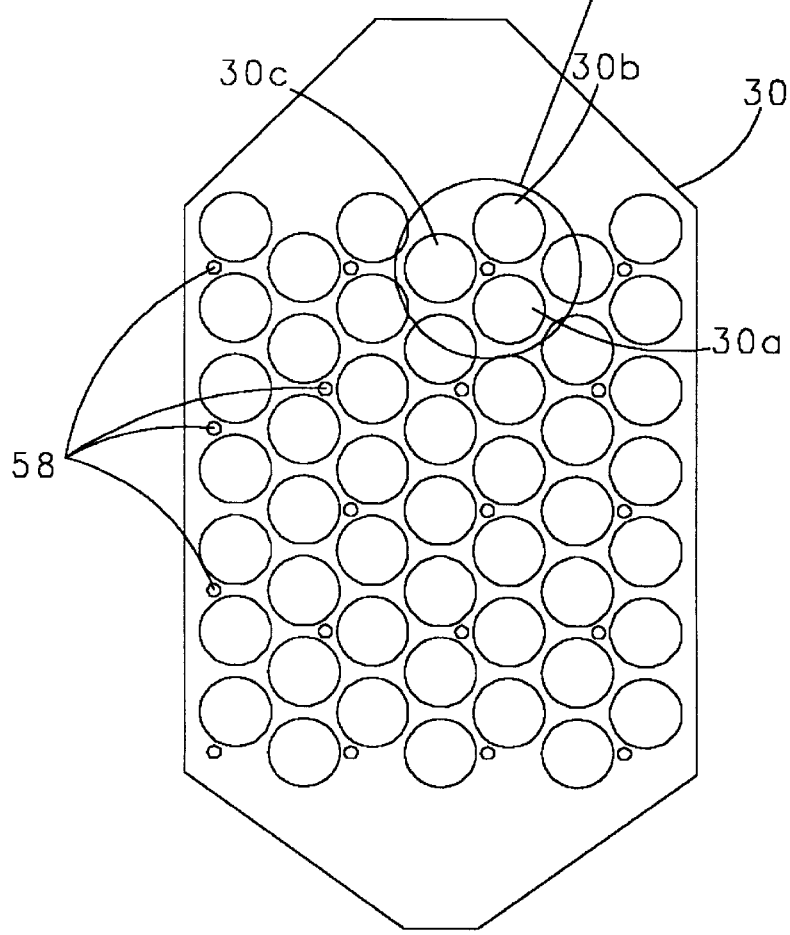
FIG. 9A
FIG. 8

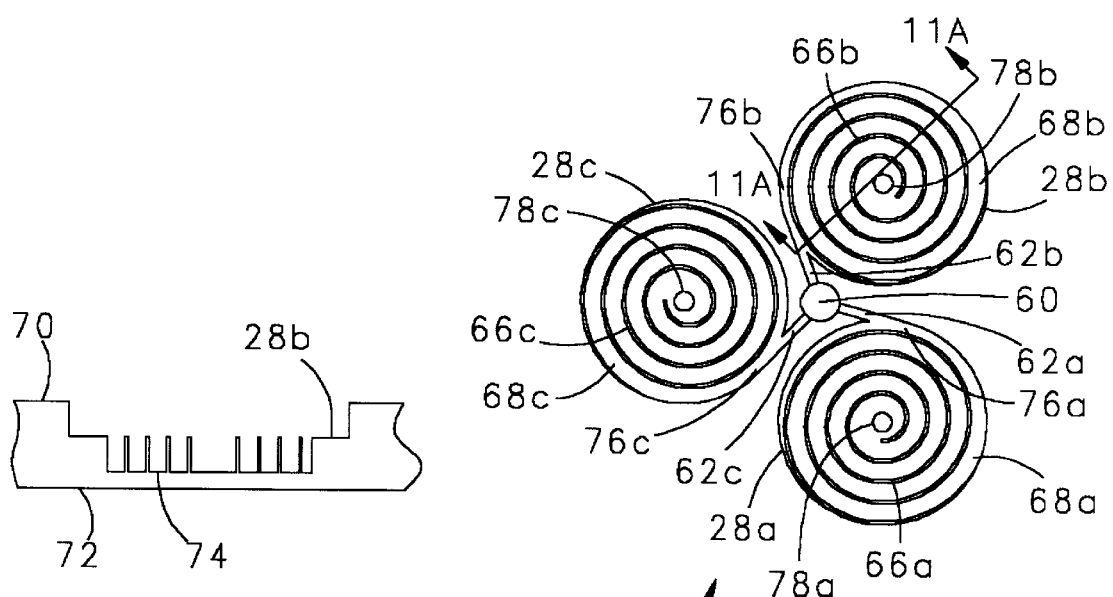
FIG. 11
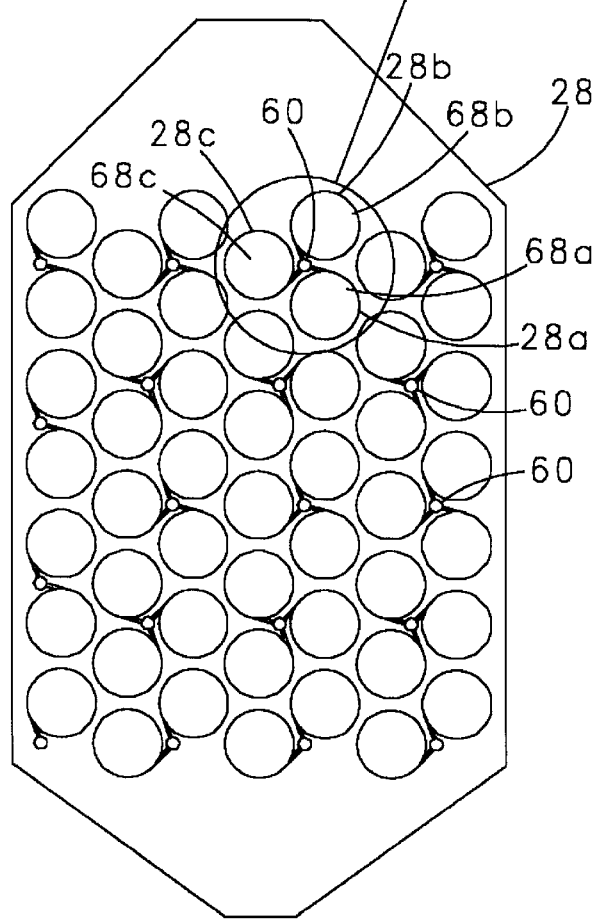
FIG. 11A
FIG. 10

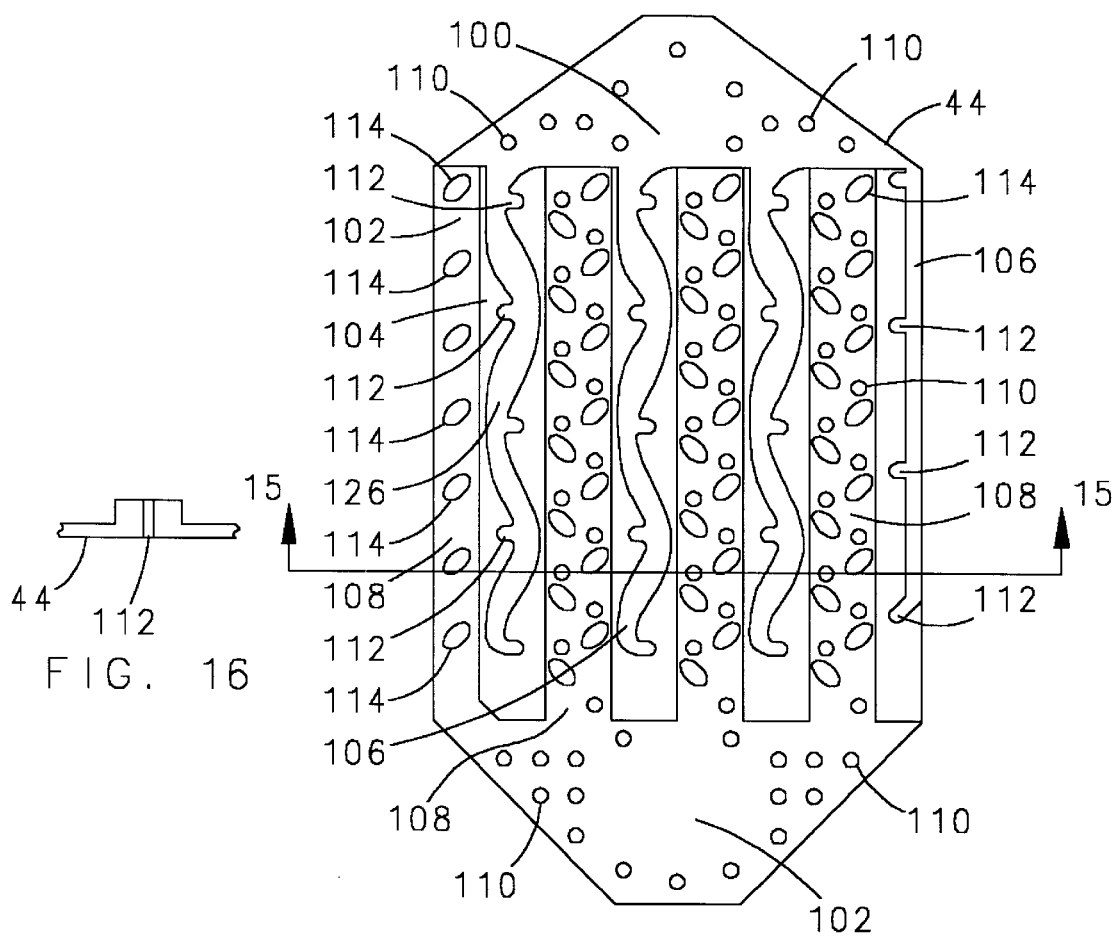
FIG. 16
FIG. 14
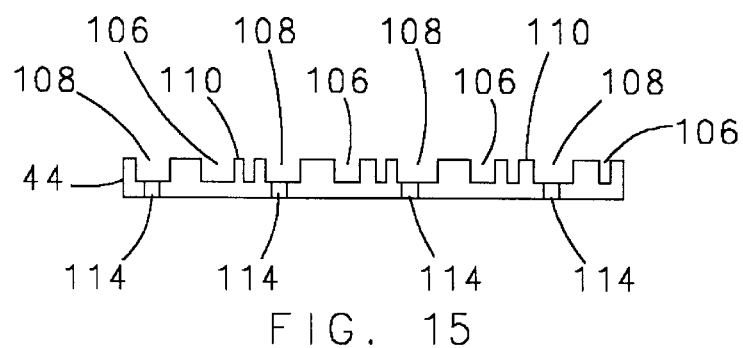
FIG. 15

HIGH INTENSITY COOLER

FIELD OF THE INVENTION

The present invention relates generally to a cooling apparatus, such as a high intensity cooling apparatus for removing heat from a high power semiconductor device.

BACKGROUND OF THE INVENTION

Various vehicles, such as aircraft and space craft, carry a substantial quantity of high power electronic devices that produce substantial quantities of heat. Although the amount of heat produced by each electronics device typically varies from application to application, increasing packaging densities, and hence increased heat production, has made thermal management an increasingly critical design consideration. In order to protect the devices and to ensure their proper operation, it is necessary that some form of device cooler be provided.

One manner of cooling such electronics devices is to circulate a coolant medium past the device such that the heat load is transferred to the coolant medium. The coolant medium is then circulated to another location where the heat is removed from the medium. Typically, such a cooling operation can be effected without changing the phase of the coolant. However, as is well known, heat exchange capacity of a given coolant medium can be substantially increased when the coolant medium undergoes a phase change, such as, for example, from the liquid phase to the vapor phase.

While many cooling systems have been proposed for cooling various heat producing devices using a vaporizable or an evaporative coolant medium, most cooling systems are not suitable for use in unusual gravitational conditions such as those encountered by spacecraft or high performance aircraft. For example, in the case of zero gravity conditions, a coolant medium in its liquid phase may lose contact with one or more of the heat transfer surfaces provided within the cooling device, thus severely degrading the performance of the cooling device. On the other hand, in the case of high performance aircraft high gravitational forces encountered during high "G" turns and other acrobatic maneuvers can propel a purely liquid coolant medium against only certain portions of the heat transfer surfaces and separate the coolant medium from the remaining heat transfer surfaces. Again, the performance of the cooling system is seriously degraded.

A variety of cooling devices are known in the art. For example, U.S. Pat. No. 4,494,171 issued to Bland et al., which is assigned to the assignee of the instant application, discloses a high efficiency cooling apparatus that uses jet impingement of coolant. Other patents, such as U.S. Pat. No. 4,559,580 issued to Lutfy, U.S. Pat. No. 4,962,444 issued to Niggemann, U.S. Pat. No. 5,016,707 issued to Nguyen, U.S. Pat. No. 5,025,856 issued VanDyke, et al., U.S. Pat. No. 5,029,640 issued to Niggemann, and U.S. Pat. No. 5,031,693 issued to Van Dyke, all disclose impingement of coolant, and are all owned by the assignee of the instant application.

Niggemann, et al., U.S. Pat. No. 4,697,427 discloses a cooling apparatus which is adapted for operation in low gravity or high gravity conditions. The device uses a spiral shaped coolant conduit to transfer heat from a heat producing component. An evaporative coolant medium is introduced as a liquid into one end of the conduit. The coolant travels through the conduit, is evaporated by the transfer of heat from the heat load, and is evacuated as a vapor from the other end of the conduit. The flow of coolant through the spiral shaped conduit forces the liquid phase coolant radially outwardly, thus causing the coolant to impinge against the spiraling outer interior wall of the conduit. Vortices generated by flowing vapor phase coolant circulate the liquid phase along the entirety of the inner wall of the conduit to wet the wall and thereby maximize the efficiency of the evaporation.

Other patents disclosing the use of spiral shaped passages in a cooling body include U.S. Pat. No. 4,614,227 issued to Vogel and U.S. Pat. No. 5,034,688 issued to Moulene.

High power density inverters and other power electronics devices are essential elements in aircraft or spacecraft having numerous electrical systems. As such electrical devices become more advanced they typically produce greater amounts of heat. Consequently, such devices require coolers capable of dissipating high intensity heat loads on the order of 100 watts per square centimeter. Absorbing such high intensity heat loads with minimal temperature drop between the power device or component and the coolant can be effected using known liquid coolers. However, a continuing need exists for an efficient and cost-effective cooling device for dissipating the very high thermal loads produced by many electronic components, using a two-phase, evaporative coolant rather than a single-phase liquid coolant. Indeed, when the electronic component is a power converter in a vapor cycle compressor motor drive, two-phase coolant is readily available for cooling purposes.

SUMMARY OF THE INVENTION

The present invention provides a high intensity cooling device capable of providing overall thermal conductance in the range of $0.1°$ C./watt/cm$^2$, and capable of handling heat flux in the range of hundreds of watts/cm$^2$ or more. The present invention is thus suitable for use with modern power electronic devices.

In accordance with a first aspect of the invention, a cooling device comprises first and second superimposed laminations, with each of the laminations including a cavity having a spiral fin defining a spiral flow chamber. One of the flow chambers directs a coolant medium along an inwardly spiraling flow path, while the other of the flow chambers directs the coolant medium along an outwardly spiraling flow path. The flow chambers are in flow communication. A coolant inlet communicates the coolant medium to the first flow chamber, and a coolant outlet communicates the coolant medium away from the second flow chamber. Thus, the coolant medium may be routed through each of the laminations along a spiral flow path.

In further accordance with a first aspect of the invention, the cooling device includes a feed conduit defined in part by aligned ports in each of the laminations, with the first lamination having a feed slot connecting the first lamination feed port to the first flow chamber. Preferably, the first lamination spiral chamber is aligned with the second lamination spiral chamber. Still preferably, a portion of the first lamination forms a base plate adapted for conductive heat transfer contact with a heat producing device.

A manifold may be superimposed over the second lamination, and may include an inlet portion in communication with the coolant inlet and an outlet portion in communication with the coolant outlet. Isolation means, for example, a bulkhead, isolates the inlet portion from the outlet portion. A cover lamination may bonded over the manifold lamination.

Each of the first and second laminations includes a top planar surface having a depression, with the first lamination depression defining a portion of the first flow chamber and the second lamination depression defining a portion of the second flow chamber. Preferably, a bottom planar surface of the second lamination overlies the first lamination depression, thereby enclosing the first flow chamber, while a bottom surface of the manifold overlies the second lamination depression thereby enclosing the second flow chamber.

Further, each of the first and second flow chambers preferably includes a periphery and a center. One of the flow chambers includes an inlet port disposed at its center and an outlet port disposed at its periphery, while the other of the flow chambers includes an inlet port disposed at its periphery and an outlet port disposed at its center. Preferably, the first flow chamber has a peripheral inlet port and a central outlet port, while the second flow chamber has a central inlet port and a peripheral outlet port.

Each of the first and second laminations may include a plurality of flow chambers, with each of the plurality of first lamination flow chambers being in flow communication with a corresponding one of the plurality of second lamination flow chambers. A plurality of flow chambers may be fed by a single feed port via a plurality of feed slots.

In accordance with a second embodiment of the invention, a cooling device includes first and second superimposed laminations, with each of the laminations including a spiral flow chamber. One of the lamination flow chambers directs a coolant medium radially inwardly, while the other of the lamination flow chambers directs the coolant medium radially outwardly. The first and second flow chambers are in flow communication with each other to define a flow path extending through the first and second lamination flow chambers in sequence. A coolant inlet communicates the coolant medium to the first lamination flow chamber, and a coolant outlet communicates the coolant medium away from the second lamination spiral chamber.

In accordance with a third embodiment of the invention, a cooling device for removing heat from a heat producing component using an evaporative coolant medium includes a plurality of superimposed laminations, with each of the laminations having a spiral flow chamber defined in part by a recess having a spiral fin and defining a spiral flow path. Each of the flow chambers is in flow communication with the flow chamber of at least one adjacent lamination. A manifold having an inlet portion and an outlet portion is provided to communicate the coolant medium in a primarily liquid phase to the flow chamber of a first one of the laminations and to communicate the coolant medium in a primarily vapor phase away from the flow chamber of a last one of the laminations.

Preferably, the manifold comprises a lamination having a cover lamination. Still preferably, the plurality of laminations comprise first and second sets of laminations, with the first and second sets of laminations being arranged in alternating fashion. The flow chambers of the first set of laminations directs the coolant medium along a radially inward spiral flow path, and the flow chambers of the second lamination direct the coolant medium along a radially outward spiral flow path. The first lamination may comprise a base plate in conductive heat transfer contact with the heat producing component, and may also include a feed slot in flow communication with the first lamination flow chamber. A feed conduit communicates the coolant medium to the feed slot. The feed conduit preferably comprises aligned feed ports in each of the laminations.

Additional features and advantages of the present invention will become readily apparent to those skilled in the art upon reading the following detailed description.

BRIEF DESCRIPTION OF THE DRAWINGS

FIG. 6 is a fragmentary plan view of a typical lamination from a first set of laminations having a plurality of outside-inside flow chambers;

FIG. 7 is an enlarged fragmentary plan view taken about the circumscribed portion of FIG. 6 and illustrating the spiral fin inside the flow chambers;

FIG. 7A is fragmentary cross-sectional view taken along line 7A—7A of FIG. 7;

FIG. 8 is a fragmentary plan view, similar to FIG. 6, but illustrating a typical lamination from a second set of laminations having a plurality of inside-outside flow chambers;

FIG. 9 is an enlarged fragmentary view taken about the circumscribed portion of FIG. 8 and illustrating the spiral fin inside the flow chambers;

FIG. 9A is fragmentary cross-sectional view taken along line 9A—9A of FIG. 9;

FIG. 10 is a fragmentary plan view similar to FIGS. 6 and 8 but illustrating a base lamination having a plurality of liquid feed slots;

FIG. 11 is an enlarged fragmentary taken about the circumscribed portion of FIG. 10 illustrating the outside-inside fin inside the spiral chamber as well as the liquid feed slots;

FIG. 11A is a fragmentary cross-sectional view taken along line 11A—11A of FIG. 11;

FIG. 14 is a plan view of the feed and drain manifold having a liquid/vapor barrier;

FIG. 15 is a cross-sectional view thereof;

FIG. 16 is an enlarged fragmentary cross-sectional view taken along line 16—16 of FIG. 14;

DESCRIPTION OF THE PREFERRED EMBODIMENTS

The embodiments described herein are illustrative and are not intended to limit the invention to precise forms disclosed. Rather, the embodiments have been chosen and described in order to best enable those skilled in the art to follow the teachings of the present invention.

Figure 1:
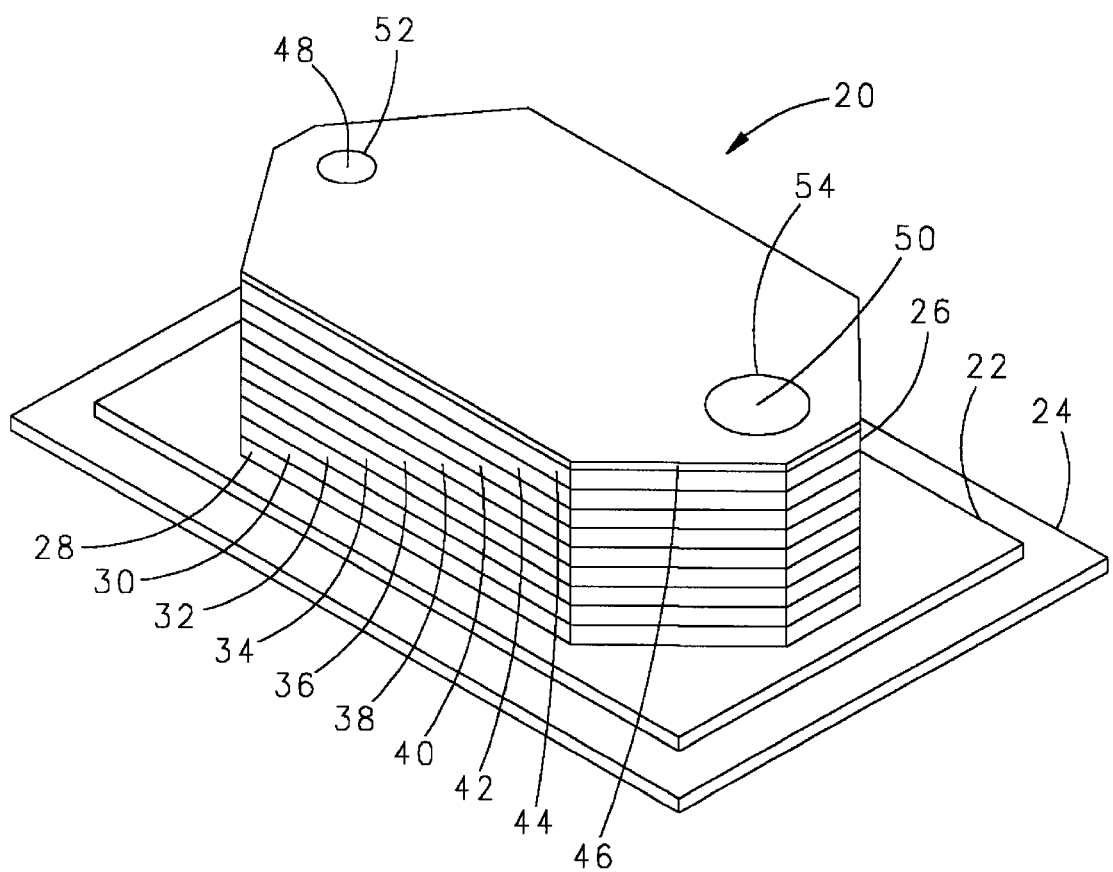
FIG. 1 is a perspective view of a high intensity cooling apparatus constructed in accordance with the teachings of the present invention.
Figure 2:
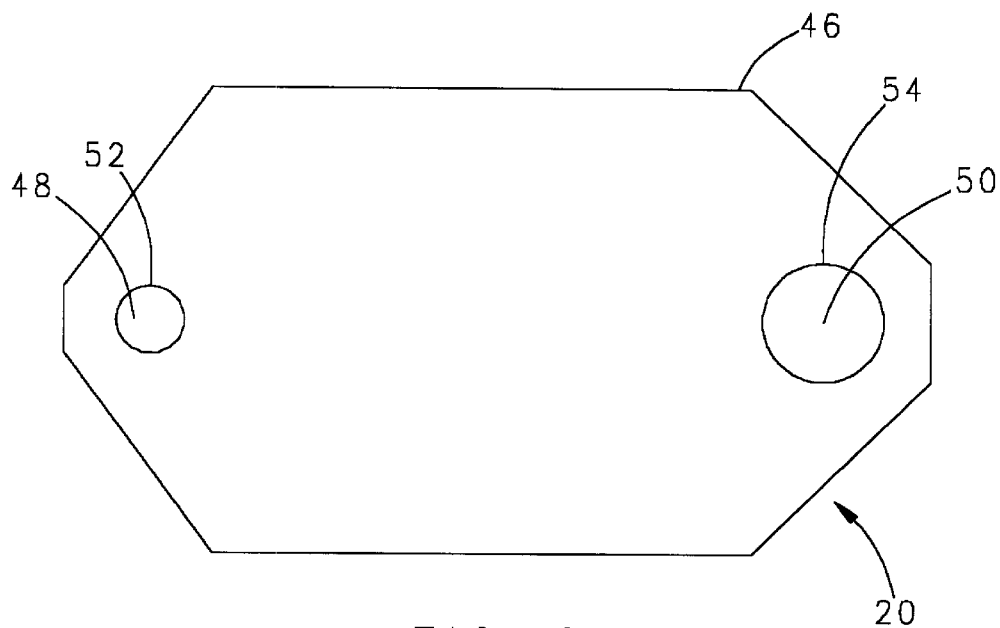
FIG. 2 is top plan view thereof.
Figure 13:
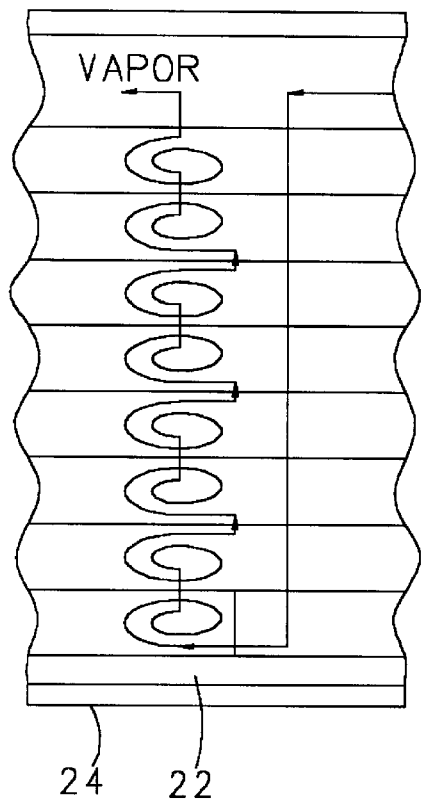
FIG. 13 is schematic view illustrating the coolant medium flow path through the cooling device.
Figure 12:
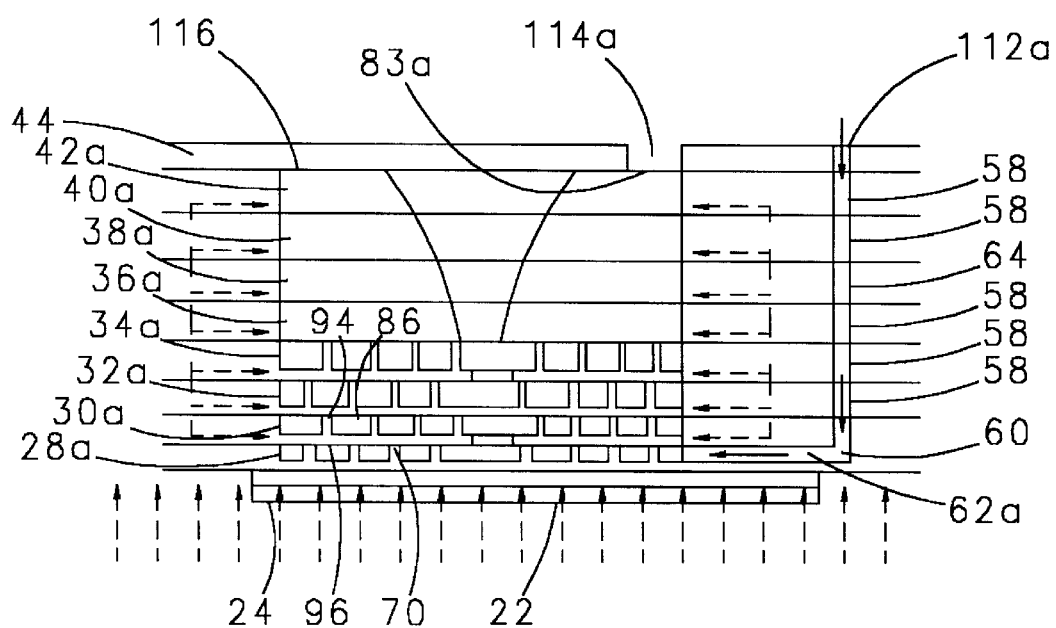
FIG. 12 is an enlarged fragmentary cross-sectional view illustrating the superimposed arrangement of swirl chambers on adjacent laminations and also illustrating one possible heat flow path from a heat producing device.
Figure 17:
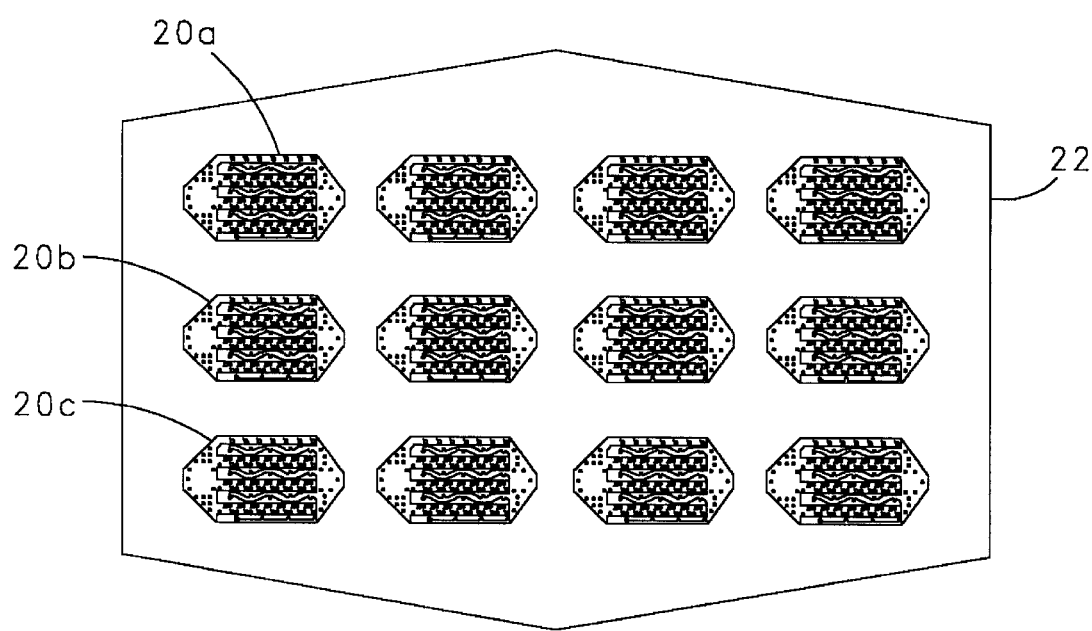
FIG. 17 is plan view of a plurality of cooling devices according to the present invention spaced at intervals on a substrate.

Referring now to the drawings, a cooling device constructed in accordance with the teachings of the present invention is generally referred to by the reference numeral 20. The cooling device 20 is mounted to a substrate 22. A heat producing electronic component 24 (or a plurality of electronic components 24) is mounted to the substrate 22 such as to be in conductive heat transfer contact with the cooling device 20 as is illustrated in FIGS. 1, 12 and 13. It will be understood by those skilled in the art that the cooling device 20 (or a collection of cooling devices 20 as illustrated in FIG. 17) operates as an evaporator in a coolant system which may have a number of system components, such as a compressor, a condenser, supply lines, pumps, valves, etc., none of which are shown in the Figures but all of which would be known in the art.

Figure 3:
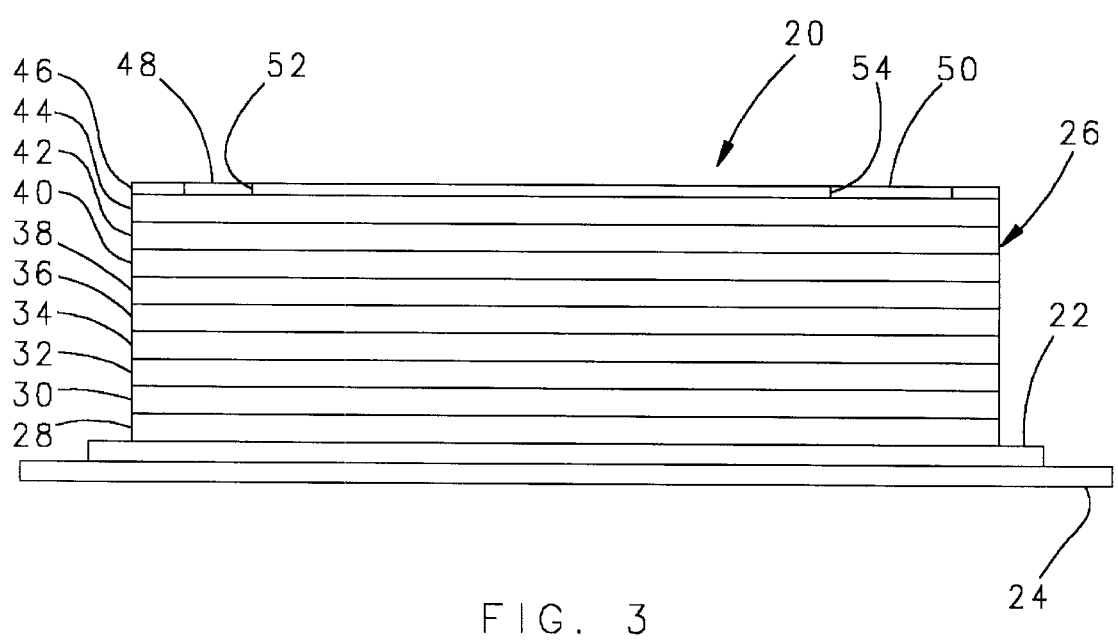
FIG. 3 is a side elevational view thereof illustrating the laminated construction of the cooling apparatus.

Referring to FIGS. 1 and 3, the cooling device 20 includes a stack 26 of aligned laminations 28, 30, 32, 34, 36, 38, 40, 42, 44 and 46. It will be understood that additional or fewer laminations may be employed. It will also be understood that the laminations 32, 36, and 40 are similar, and along with the first lamination 28 may be grouped into a first set of laminations, while the laminations 30, 34, 38 and 42 are similar and may be grouped into a second set of laminations. The lamination 44 is a manifold lamination as will be described in greater detail below, and the lamination 46 is a cover lamination. It will also be understood that the laminations may be joined together by diffusion bonding as is known in the art. The cooling device 20 further includes a coolant inlet 48 and a coolant outlet 50, such as in the form of apertures 52, 54, respectively, through the cover lamination 46.

Figure 4:
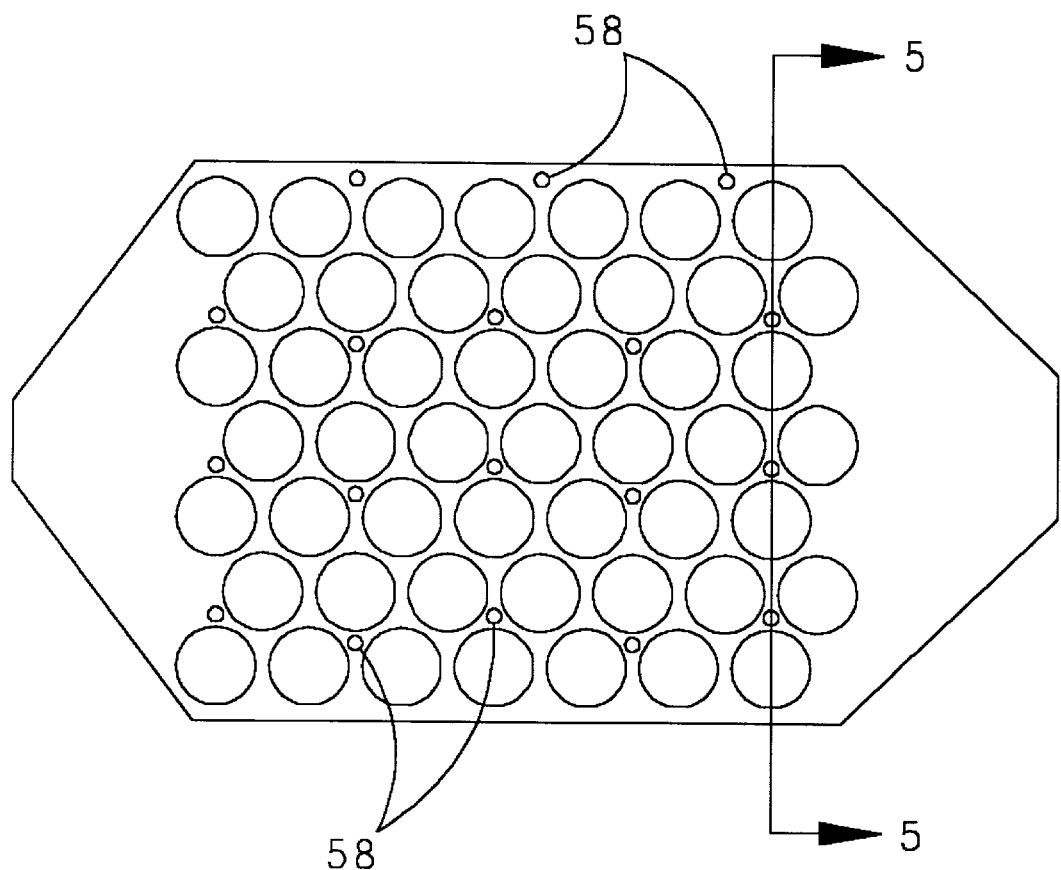
FIG. 4 is a fragmentary plan view of one possible lamination construction illustrating the location of the coolant feed ports relative to the flow chambers.
Figure 5:
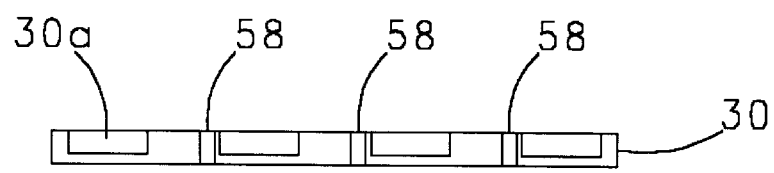
FIG. 5 is a fragmentary cross-sectional view taken along line 5—5 of FIG. 4.

Referring now to FIGS. 4 and 5, each of the laminations 30, 32, 34, 36, 38, 40, 42 includes a plurality of bores or feed ports 58 extending through the laminations, such as is shown in FIG. 5. Although only the lamination 30 is shown in FIGS. 4 and 5, it will be understood that the remaining laminations will have a layout similar to that shown and will have identical placement of the feed ports 58. As shown in FIG. 12, when the stack 26 of laminations is assembled, the feed ports 58 combine to form a feed conduit 64 which communicates the coolant medium from the inlet 48 to the base lamination 28 as will be explained below.

As shown in FIGS. 10, 11, and 11A, the first lamination 28 includes a plurality of partial bores or feed ports 60, each of which feeds into a plurality of feed grooves or slots 62a, 62b and 62c shown in FIGS. 10 and 11. As shown in FIG. 12, when the stack 26 of laminations is assembled, the feed ports 58 combine to form a feed conduit 64 which communicates the coolant medium from the inlet 48 to the partial feed port 60 and hence to the feed grooves or slots 62a, 62b, and 62c.

As shown in FIGS. 10, 11 and 11A, the first or first lamination 28 includes a plurality of flow chambers, 28a, 28b, 28c, . . . 28n, with three such flow chambers 28a, 28b and 28c being shown in FIG. 7. It will be understood that the first lamination 28 may include many more flow chambers. Each of the chambers 28a, 28b, and 28c includes a spiraling wall or fin 66a–c disposed in a recess 68a–c, respectively. The lamination 28 also includes an upper surface 70, a lower surface 72 and a web 74. As shown in FIG. 12, the web 74 of the of the lamination 28 forms a base plate which contacts the substrate 22 which is in conductive heat relationship with the heat producing component 24. Referring again to FIGS. 10, 11 and 11A, each flow chamber 28a–c includes a peripheral input port 76a–c, and a central output port 78a–c, respectively. As shown in FIG. 11, each input port 76a–c is connected to the partial feed port 60 by one of the grooves or slots 62a–c, respectively.

With respect to the remaining laminations on the first set, i.e., the laminations 32, 36 and 40, each also includes at least one flow chamber 32a, 36a and 40a as shown in FIG. 12. For the sake of convenience, only the flow chambers associated with the lamination 32 will be described herein in detail as shown in FIGS. 6, 7 and 7A. It will be understood that the flow chambers of the remaining laminations in the first set will be similar. Referring to FIGS. 6 and 7, the lamination 32 includes a plurality of flow chambers 32a, 32b, 32c, . . . 32n. Three such flow chambers 32a–c are shown in FIG. 7. Each of the flow chambers includes a spiraling wall or fin 80a–c disposed in a recess 82a–c, and also includes a peripheral input port 77a–c and a central output port 79a–c. As shown in FIG. 7, each flow chamber 32a–c may be provided with a plurality of input ports 77a–c. The lamination 32 also includes an upper surface 84, a lower surface 86 and a web 88.

As shown in FIGS. 8, 9 and 9A with respect to the laminations 30, 34, 38 and 42 in the second set, each of the laminations includes at least one flow chamber 30a, 34a, 38a, and 42a. For the sake of convenience, only the flow chambers associated with the lamination 30 will be described herein in detail. It will be understood that the flow chambers of the remaining laminations in the second set will be similar. The lamination 30a includes a plurality of flow chambers 30a, 30b, 30c, . . . 30n, with three such flow chambers 30a–c being shown in FIG. 7. Each of the flow chambers includes a spiraling fin or wall 90a–c disposed in a recess 92a–c, respectively, and further includes a central input port 81a–c and a peripheral output port 83a–c. The lamination 30 also includes an upper surface 94, a lower surface 96, and a web 98.

It will be understood that when the above referenced stack 26 is assembled by superimposing the laminations as shown in FIGS. 1, 2, 12 and 13, the flow chambers 28a, 30a, 32a, 34a, 36a, 38a, 40a and 42a will all be aligned as shown in FIG. 12. When thus superimposed, a coolant medium flow path is created which proceeds in spiral fashion through each of the aligned flow chambers 28a, 30a, 32a, 34a, 36a, 38a, 40a and 42a. As can be seen in FIG. 13, due to the alternating arrangement of the laminations from the first and second sets, the flow path may spiral inwardly in the first set of laminations and outwardly in the second set of laminations. It will also be understood that the flow chambers 28b, 30b, 32b . . . will be similarly aligned. Consequently, each flow chamber from each lamination will be aligned with their corresponding flow chambers in the adjacent laminations.

Although stated above the laminations 28, 32, 26 and 40 in the first set are similar, they need not be identical. As shown in FIG. 12, the flow chambers 28a, 32a, 36a and 40a differ slightly in that the cross-sectional area of the passageway between their respective fins is slightly greater with each successive lamination (i.e., the cross-sectional area of the passageway defined in the lamination 28 is slightly less than that in the lamination 32, the cross-sectional area of the passageway defined in the lamination 32 is slightly less than that in the lamination 36, and the cross-sectional area of the passageway defined in the lamination 36 is slightly less than that in the lamination 40). The same holds true for the second set of laminations 30, 34, 36 and 42 (i.e., the cross-sectional area of the passageway defined in the lamination 30 is slightly less than that in the lamination 34, the cross-sectional area of the passageway defined in the lamination 34 is slightly less than that in the lamination 38, and the cross-sectional area of the passageway defined in the lamination 38 is slightly less than that in the lamination 42).

Referring now to FIGS. 14, 15 and 16, the manifold 44 includes an inlet side 100, an outlet side 102, and a dividing bulkhead 104. It will be appreciated that the inlet side 100 includes a number of extending passages 106, while the outlet side 102 also includes a number of extending passages 108, with the passages 106 and 108 being separated by the bulkhead 104. The aperture 52 in the top cover 46 permits the coolant medium to be communicated to the inlet side 100, while the aperture 54 in the top cover 46 permits the coolant medium to be removed or exhausted from the outlet side 102. A number of spacing or support posts 110 are provided which are spaced throughout the inlet side 100 and the outlet side 102. The support posts 110 helps to support the top cover 46, which is preferably bonded to the manifold 44. The manifold 44 also includes a plurality of liquid feed ports 112 and vapor exhaust ports 114. Each of the liquid feed ports is aligned with a corresponding feed port 58 in the adjacent lamination 42, such that the inlet side 100 is in flow communication with the feed conduit 64. Similarly, each of the exhaust ports 114, i.e., exhaust ports 114a, . . . 114n, is in flow communication with the outlet port of the adjacent flow chambers, i.e. flow chambers 42a, . . . 42n of the lamination 42. As shown in FIG. 12, the outlet port 83a of the flow chamber 42a is in flow communication with a corresponding one of the exhaust ports 114a.

In operation, the cooling device 20 is assembled by superimposing or stacking the laminations 28, 30, 32, 34, 36, 38, 40, 42, 44 and 46 as shown in FIGS. 1, 3 and 12. Again, additional or fewer laminations may be employed. As shown in FIG. 12, the flow chambers of each lamination, i.e. the corresponding flow chambers 28a, 30a, 32a, 34a, 36a, 38a, 40a and 42a will all be superimposed or aligned. The output port 78a of the chamber 28a is in flow communication with the input port 81a of the flow chamber 30a of lamination 30. Similarly, the output port 83a of the flow chamber 30 is in flow communication with the input port 77a of the flow chamber 32a. As shown in FIG. 12 and as shown schematically in FIG. 13, a coolant flow path is created which proceeds spirally through the corresponding flow chambers 28a, 30a, 32a, 34a, 36a, 38a, 40a, and 42a. Further, when the laminations are so arranged, each of the feed ports 58 will be aligned to form the feed conduit 64.

As shown in FIG. 12, the lower surface 96 of the lamination 30 overlies the upper surface 70 of the lamination 28 and thus encloses the flow chambers 28a–n. Similarly, the lower surface 86 of the lamination 32 overlies the upper surface 94 of the lamination 30, thus enclosing the flow chambers 30a–n. The remaining flow chambers are similarly enclosed by the lower surface of the adjacent and overlying laminations, the flow chambers 42a–n being enclosed by a lower surface 116 of the manifold 44.

A coolant medium is delivered to through the coolant inlet 48. Preferably, the coolant medium is an evaporative coolant, which is preferably a pure substance or an azeotropic mixture, such as R134a. The coolant medium may be supplied to the coolant inlet in partly or a primarily liquid form. From the coolant inlet, the coolant medium is routed to the manifold 44 and is distributed to each of the passages 106 on the inlet side 100 of the bulkhead 104. From there, the coolant medium enters the feed ports 112 and proceeds downwardly through any one of the many feed conduits 64 defined by the aligned feed ports 58 in the laminations 28, 30, 32, 34, 36, 38, 40 and 42. When the coolant medium reaches the partial bore 60 which does not penetrate the web 74 of the base lamination 28, the coolant medium proceeds via the associated feed slots, i.e., the feed slots 62a–c, outwardly to the flow chambers 28a–c via the entry ports 76a–c, respectively. It will be understood that the slots 62a–c may be formed in the upper surface 70 of the base lamination 28, such that the overlying bottom surface 96 of the lamination 30 encloses each of the slots 62a–c to thus form a conduit.

The coolant medium spirals radially inwardly from the periphery toward the center of each of the flow chambers 28a–c. As shown in FIGS. 12 and 13, the coolant medium next flows through the flow chambers 30a, 32a, 34a, 36a, 38a, 40a, and 42a, proceeding radially inwardly in the laminations of the first set (i.e., laminations 28, 32, 36, and 40) and radially outwardly in the laminations of the second set (i.e., laminations 30, 34, 38 and 42).

As shown in FIG. 12, heat from the heat producing component 24 is distributed throughout the cooler device 20 via a heat flow path proceeding upwardly through the stack 26, and laterally across the stack 26 via the webs 74, 88 and 98 the laminations in the first and second sets. The coolant medium is evaporated or at least partially vaporized by the heat absorbed from the heat producing component 24. The heat from the component 24 thus flows into the web portions of laminations 28, 30 and 32, and thence into the flow chambers 28a, 30a and 32a through the floors and walls of the flow chambers and into the coolant medium (and similarly through the webs, walls, and flow chambers of the remaining laminations). The coolant is passed through the each of the chambers upwardly until the coolant reaches the manifold 44. The partially or fully vaporized coolant is then exhausted through the coolant outlet 54 and is subsequently cooled or otherwise converted back to its liquid form by other cooling system components (not shown) as is known in the art.

In order to ensure reasonably high efficiency, the full thickness web area of each of the first and second sets of laminations should be in the range of 40–60% (forty to sixty percent) of the total footprint area. The laminations are preferrably copper. Still further, the outside diameter of the flow chambers may be in the range of about 0.09 inches, and each of the flow chambers may have a bottom wall thickness in the range of about 0.007 inches. Further, the flow channel dimensions preferably range between approximately 0.080 inches square to 0.100 inches square, which will ensure that relatively modest shear forces will keep the surrounding flow chamber surfaces wet. Because most of the heat will be conducted up through the webs of the laminations and hence over an area much larger than the footprint of the power electronics device or other heat producing component, "burnout" or "critical" heat flux will be avoided.

Figure 18:
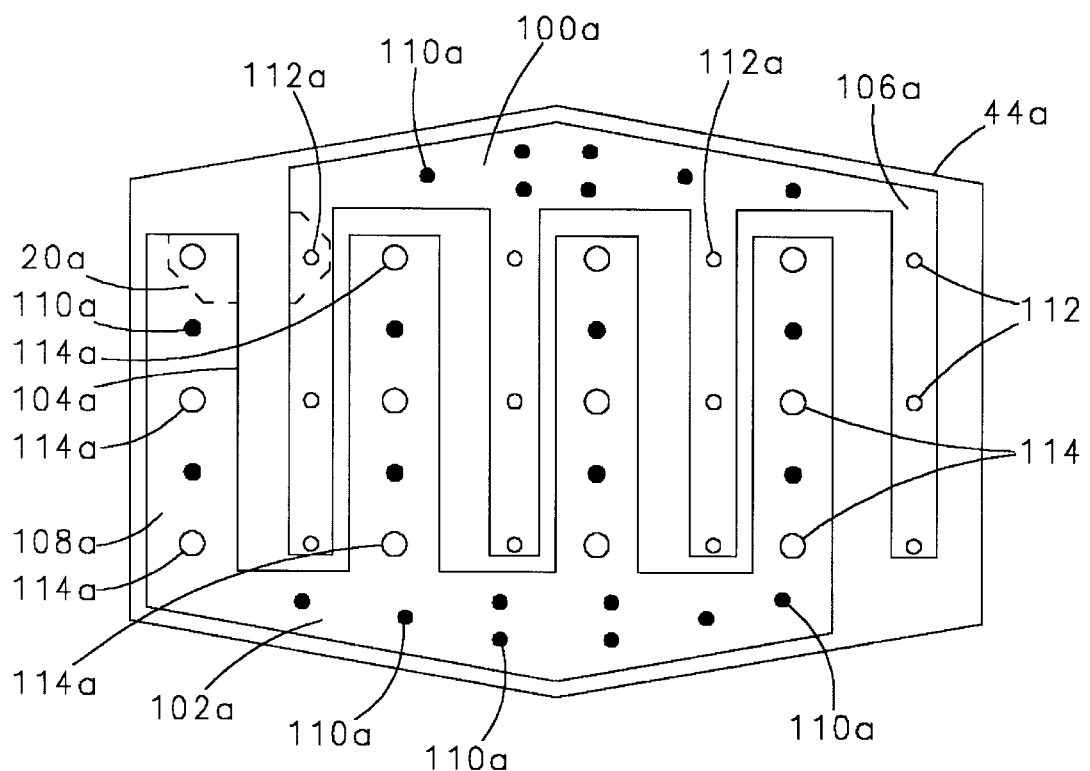
FIG. 18 is a main manifold for use with the plurality of cooling devices shown in FIG. 17.
Figure 19:
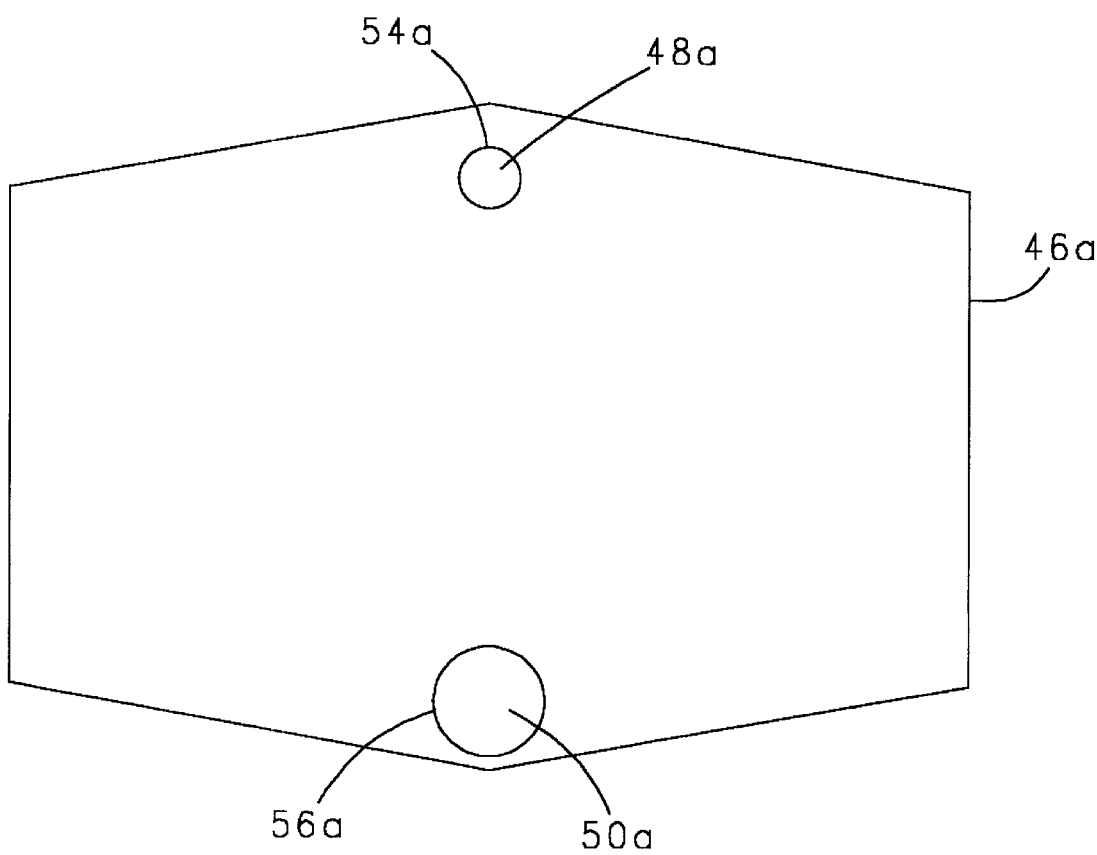
FIG. 19 is a cover for use with the main manifold of FIG. 18.

Referring now to FIGS. 17–19, it will be understood that a plurality of cooling devices 20 (i.e., cooling devices 20a, 20b, 20c, . . . 20n) may be attached to the substrate 22 as shown. Each device 20a–n may be in conductive heat transfer relationship with a separate heat producing component (not shown). When so arranged, the plurality of cooling devices 20a–n may be supplied with coolant via a common main manifold 44a. The main manifold 44a includes an inlet side 100a, an outlet side 102a, and a dividing bulkhead 104a. It will be appreciated that the inlet side 100a includes a number of extending passages 106a, while the outlet side 102a also includes a number of extending passages 108a, with the passages 106a and 108a being separated by the bulkhead 104a. As shown in FIG. 19, an aperture 52a in the top cover 46a permits the coolant medium to be communicated to the inlet side 100a, while the aperture 54a in the top cover 46a permits the coolant medium to be removed or exhausted from the outlet side 102a. A number of spacing or support posts 110a are provided which are spaced throughout the inlet side 100a and the outlet side 102a and which support the top cover 46a which is preferably bonded to the main manifold 44a. The manifold 44a also includes a plurality of liquid feed ports 112a and vapor exhaust ports 114a. Each of the liquid feed ports 112a is aligned with a corresponding fluid inlet 54 of an adjacent cooling device, e.g., the cooling device 20a. The cooling device 20a (shown in phantom in FIG. 18) is positioned such that the inlet 54 of the cooling device 20a is disposed on the inlet side 100a of the main manifold 44a and with the outlet 56 of the cooling device 20a positioned on the outlet side 102a of the main manifold 44a. The remaining cooling devices 20b–n are positioned in a similar manner. The coolant medium is provided through the inlet 54a of the top cover 46a and is distributed via the feed ports 20a–n to the various cooling devices 20a–n for circulation therethrough in the manner which has been described in detail above. After circulation therethrough, the coolant in at least a partly vapor form is exhausted from the coolant outlet 56a.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed:

1. For use with a coolant medium, a cooling device comprising:
   first and second superimposed laminations, the laminations being disposed in direct contact with each other, each of the laminations including a cavity having a spiral fin defining a spiral flow chamber, one of the flow chambers directing the coolant medium along an inwardly spiraling flow path, the other of the flow chambers directing the coolant medium along an outwardly spiraling flow path, the first and second flow chambers being in flow communication;
   a coolant inlet in flow communication with first flow chamber; and
   a coolant outlet in flow communication with the second flow chamber;
   whereby the coolant medium may be routed through each of the laminations along a spiral flow path.

2. The cooling device of claim 1, including a feed conduit defined in part by aligned ports in each of the laminations, the first lamination including a feed slot connecting the first lamination feed ports to the first flow chamber.

3. The cooling device of claim 1, wherein the first lamination spiral chamber is aligned with the second lamination spiral chamber.

4. The cooling device of claim 1, wherein a portion of the first lamination comprises a base plate in conductive contact with a heat producing component.

5. The cooling device of claim 1, in combination with a heat producing component, the heat producing device being in conductive heat transfer relation with at least one of the first or second laminations.

6. The cooling device of claim 1, further including a manifold superimposed over the second lamination and having an inlet portion in communication with the coolant inlet and an outlet portion in communication with the coolant outlet, and further including a bulkhead isolating the inlet portion from the outlet portion.

7. The cooling device of claim 6, wherein the manifold includes a cover lamination.

8. The cooling device of claim 6, wherein the manifold includes isolation means for isolating the inlet portion from the outlet portion.

9. The cooling device of claim 1, wherein the first and second laminations each include a top planar surface having a depression, the first lamination depression defining a portion of the first flow chamber and the second lamination depression defining a portion of the second flow chamber.

10. The cooling device of claim 9, wherein the second lamination includes a bottom planar surface overlying the first lamination depression thereby defining a portion of the first flow chamber, and including a top plate overlying the second lamination depression thereby defining a portion of the second flow chamber.

11. The cooling device of claim 10, wherein the top plate comprises a manifold for communicating the coolant medium into the coolant inlet and out of the coolant outlet.

12. The cooling device of claim 1, wherein each of the first and second flow chambers includes a periphery and a center, one of the flow chambers having an inlet port disposed at its center and an outlet port disposed at its periphery, the other of the flow chambers having an inlet port disposed at its periphery and an outlet port disposed at its center.

13. The cooling device of claim 12, wherein the first flow chamber inlet port is disposed at its periphery and the first flow chamber outlet port is disposed at its center, and further wherein the second flow chamber inlet port is disposed at its center and second flow chamber outlet port is disposed at its periphery.

14. The cooling device of claim 1, wherein each of the first and second laminations includes a plurality of flow chambers, each of the plurality of first lamination flow chambers being in flow communication with the coolant inlet and further being in flow communication with a corresponding one of the plurality of second lamination flow chambers.

15. The cooling device of claim 2, wherein the first flow chamber includes a peripheral portion in flow communication with the first lamination feed slot, and further wherein the first lamination flow chamber directs the coolant medium radially inwardly.

16. A cooling device, comprising:
   first and second superimposed and generally planar laminations, the laminations being disposed in direct contact with each other each of the laminations including a spiral flow chamber, the flow chamber of the first lamination including a fin defining a flow path spiraling in a first radial direction, the flow chamber of the second lamination including a fin defining a flow path spiraling in a second radial direction, the first and second flow chambers being in direct contact and in flow communication with each other to define a spiral flow path extending through the first and second lamination flow chambers in sequence;
   a coolant inlet for communicating the coolant to the first lamination flow chamber; and
   a coolant outlet for communicating the coolant away from the second lamination spiral chamber.

17. The cooling device of claim 16, wherein the laminations include aligned feed ports, the feed ports being in flow communication with the coolant inlet to thereby communicate the coolant medium to the first lamination flow chamber.

18. The cooling device of claim 16, wherein the first and second flow chambers are aligned.

19. The cooling device of claim 16, wherein the first lamination includes a feed line to communicate the coolant medium from the coolant inlet to the first lamination flow chamber.

20. The cooling device of claim 16, in combination with a heat producing device, and wherein a portion of the first lamination is in conductive heat transfer contact with the heat producing device.

21. The cooling device of claim 16, including a manifold in flow communication with flow chamber of the first lamination.

22. The cooling device of claim 16, further including a manifold lamination superimposed over the second lamination and having an inlet portion in communication with the coolant inlet and an outlet portion in communication with the coolant outlet, and further including a bulkhead isolating the inlet portion from the outlet portion.

23. The cooling device of claim 22, wherein the manifold laminations includes a cover lamination.

24. The cooling device of claim 16, wherein the first and second flow chambers are defined in part by depressions in the first and second laminations.

25. The cooling device of claim 24, including a manifold lamination overlying the second lamination, and wherein the first flow chamber is further defined in part by an overlying portion of the second lamination, and further wherein the second flow chamber is further defined in part by an overlying portion of the manifold lamination.

26. The cooling device of claim 16, wherein each of the first and second flow chambers includes a periphery and a center, one of the flow chambers having an inlet port disposed at the center and an outlet port disposed at the periphery, the other of the flow chambers having an inlet port disposed at the periphery and an outlet port disposed at the center.

27. For removing heat from a heat producing component using an evaporative coolant medium, a cooling device comprising:

a plurality of superimposed laminations, each of the laminations having a spiral flow chamber defined in part by a recess having a spiral fin and defining a spiral flow path, each of the flow chambers being in flow communication with the flow chamber of at least one adjacent lamination; and a manifold having an inlet portion adapted to communicate the coolant medium to the flow chamber of a first one of the laminations, the manifold further having an outlet portion adapted to communicate the coolant medium away from the flow chamber of a last one of the laminations;

whereby the coolant medium exists at the inlet portion primarily as a liquid and further exists at the outlet portion primarily as a vapor.

28. The cooling device of claim 27, wherein the manifold comprises a lamination having a cover lamination.

29. The cooling device of claim 27, wherein the plurality of laminations comprise first and second sets of laminations, the first and second sets of laminations being arranged in alternating fashion, the flow chambers of the first set of laminations being adapted to direct the coolant medium along a radially inward flow path, the flow chambers of the second lamination being adapted to direct the coolant medium along a radially outward flow path.

30. The cooling device of claim 27, wherein a web portion of the first lamination comprises a base plate in conductive heat transfer contact with the heat producing component.

31. The cooling device of claim 27, wherein the first lamination includes a feed slot in flow communication with the first lamination flow chamber, and including a feed conduit adapted to communicate the coolant medium to the feed slot.

32. The cooling device of claim 31, wherein a web portion of the first lamination comprises a heat conductive base plate, and wherein the feed conduit comprises aligned feed ports in each of the remaining laminations.

33. For use with a coolant medium, a cooling device comprising:

first and second superimposed laminations, each of the laminations including a top planar surface having a depression and a bottom planar surface, the depression of each lamination forming a cavity having a spiral fin defining a spiral flow chamber, the first lamination depression defining a portion of the first flow chamber and the second lamination depression defining a portion of the second flow chamber, the second lamination further having a bottom planar surface overlying the first lamination depression thereby defining a portion of the first flow chamber, one of the flow chambers directing the coolant medium along an inwardly spiraling flow path, the other of the flow chambers directing the coolant medium along an outwardly spiraling flow path, the first and second flow chambers being in flow communication;

a coolant inlet in flow communication with first flow chamber; and a coolant outlet in flow communication with the second flow chamber; and a top plate overlying the second lamination depression thereby defining a portion of the second flow chamber, the top plate further comprising a manifold for communicating the coolant medium into the coolant inlet and out of the coolant outlet;

whereby the coolant medium may be routed through each of the laminations along a spiral flow path.

34. The cooling device of claim 33, wherein each of the laminations includes a plurality of depressions, each of the plurality of depressions having a cavity and a spiral fin defining a spiral flow chamber.

35. A cooling device, comprising:

first and second superimposed and generally planar laminations, each of the laminations including a plurality of similar spiral flow chambers, each of the flow chambers of the first lamination including a fin defining a flow path spiraling in a first radial direction, each of the flow chambers of the second lamination including a fin defining a flow path spiraling in a second radial direction, each of the first flow chambers being in flow communication with a corresponding one of the second flow chambers to define a spiral flow path extending through the first and second lamination flow chambers in sequence;

a coolant inlet for communicating the coolant to each of the first lamination flow chambers; and a coolant outlet for communicating the coolant away from the second lamination flow chambers.

* * * * *